United States Patent [19]

Calhoun et al.

[11] 4,234,888
[45] Nov. 18, 1980

[54] MULTI-LEVEL LARGE SCALE COMPLEX INTEGRATED CIRCUIT HAVING FUNCTIONAL INTERCONNECTED CIRCUIT ROUTED TO MASTER PATTERNS

[75] Inventors: Donald F. Calhoun, Inglewood; Barry Bennett, Wilmington, both of Calif.

[73] Assignee: Hughes Aircraft Company, Culver City, Calif.

[21] Appl. No.: 382,993

[22] Filed: Jul. 26, 1973

Related U.S. Application Data

[60] Division of Ser. No. 209,397, Dec. 17, 1973, Pat. No. 3,795,975, which is a continuation of Ser. No. 16,840, Mar. 5, 1970, abandoned.

[51] Int. Cl.$^3$ ............................................. H01L 27/04
[52] U.S. Cl. ........................................ 357/45; 357/40; 357/71
[58] Field of Search ................... 29/574; 317/101 A; 357/40, 54, 45, 71

[56] References Cited

U.S. PATENT DOCUMENTS

| | | | |
|---|---|---|---|
| 3,303,400 | 2/1967 | Allison | 317/101 A |
| 3,423,822 | 1/1969 | Davidson et al. | 317/101 A |
| 3,434,020 | 3/1969 | Ruggiero | 317/101 A |
| 3,518,751 | 7/1970 | Waters et al. | 317/101 A |

FOREIGN PATENT DOCUMENTS 1117579 6/1968 United Kingdom ................ 317/101 A

*Primary Examiner*—David Smith, Jr.
*Attorney, Agent, or Firm*—Lewis B. Sternfels; W. H. MacAllister

[57] ABSTRACT

A complex integrated circuit comprising a wafer which has a plurality of cells each having signal-connect pads in a first layer of metalization on the wafer and which has an imperfect yield of usable cells. The circuit further includes a laminae of alternate layers of dielectric insulation and metalization formed on the wafer wherein: a first layer of insulation has vias formed therethrough to expose signal-connect pads of selected usable cells; a second layer of metalization has conductors formed therein which operably interconnect the exposed signal-connect pads of one or more groups of usable cells into individual functional circuits and, where needed, include pad relocation conductors which route the signal-connects of individual cells and the signal-connects of interconnected groups of cells to master pattern circuit locations; a second layer of insulation has vias formed therethrough which expose signal-connect portions at the master pattern circuit locations; and a third layer of metalization is formed into conductors that interconnect the signal-connects at master pattern locations into a functionally specified circuit type.

21 Claims, 7 Drawing Figures

MULTI-LEVEL LARGE SCALE COMPLEX INTEGRATED CIRCUIT HAVING FUNCTIONAL INTERCONNECTED CIRCUIT ROUTED TO MASTER PATTERNS

This is a division of application Ser. No. 209,397, filed Dec. 17, 1971, now U.S. Pat. No. 3,795,975 issued Mar. 12, 1974, in turn a continuation of application Ser. No. 16,840, filed Mar. 5, 1970, now abandoned.

BACKGROUND OF THE INVENTION

This invention relates generally to improvements in the fabrication of multi-level complex integrated circuits and relates more particularly to means and methods of interconnecting cells of a wafer having an imperfect yield by interconnecting and routing the signal-connects of cells to master pattern circuit locations in one level of metalization that are compatible with a master pattern of interconnect conductors in a next upper layer of metalization.

In integrated circuit technology, wafers having a nonuniform yield of usable cells have heretofore been interconnected into functional circuit types by producing a plurality of masks tailored for that particular wafer's yield distribution, each mask being associated with an individual alternate layer of dielectric insulation or metalization formed on the wafer.

The first one of these masks was utilized during fabrication to define and form feedthroughs or vias in a first layer of insulation exposing the pads of selected usable cells at the first layer of metalization on the wafer. A second mask was utilized to form a second layer of metalization into conductors associated with the vias in the first layer of insulation and routed into coincidence with via locations which were subsequently formed in a second layer of insulation by a third mask. At least one and possibly more alternate layers of metalization were formed on top on the second layer of insulation and fabricated into interconnect lines and cross-overs as defined by at least a fourth mask whereupon all of the selected usable cells were electrically interconnected into a functionally specified complex integrated circuit type.

Thus, it can be seen that this technique required that the multiple mask for each wafer had to be tailored or laid out for a particular wafer since the yield distribution of usable cells varied from wafer to wafer.

SUMMARY OF THE INVENTION

Objects, features and advantages of this invention can be attained with provision of an integrated circuit wafer having a nonuniform yield distribution of usable cells and alternate layers of dielectric insulation and metalization formed in a laminae on top of the wafer. The first layer of insulation has vias fabricated therethrough tailored to that particular wafer yield distribution for exposing signal-connects of selected usable cells to a second layer of metalization formed thereupon. This second layer of metalization is in turn formed into conductors which functionally interconnect the exposed signal-connects of a number of the usable cells into one or more of a number of commonly used functional circuits and, where needed, includes pad relocation conductors which route signal-connects including signal-connects for the functionally interconnected groups of cells and any exposed signal-connects for individual cells to master pattern circuit locations. Thereafter, a second layer of insulation having vias at master pattern circuit locations is formed thereupon to expose the signal connects at the master pattern locations of the second layer of metalization. Then a third layer of metalization is formed on top of the second layer of insulation and formed into a fixed or master pattern of interconnect lines as defined by a standard mask to functionally interconnect the master pattern signal-connects of usable cells into a specified circuit part type.

Advantages of this circuit are that: a reduction is made in the number of point to point connections occurring in the third level of metalization having the fixed or master pattern conductor routing thereon: there is a decrease in the number of master pattern circuit locations required in fabricating a complex integrated circuit array since cells are first interconnected in the second layer of metalization; there is a decrease in the number of pad relocation lines required in the second level of metalization patterns there is a significant reduction in the average signal line length in both the second and third layers of metalization due to the shortened line length usable to functionally interconnect usable cells whereupon signal degradation resulting from line resistance and capacitance is reduced.

BRIEF DESCRIPTION OF THE DRAWINGS

Other objectives, features and advantages of this invention will become apparent upon reading the following detailed description and referring to the accompanying drawings wherein.

DESCRIPTION OF A PREFERRED EMBODIMENT

Figure 1:
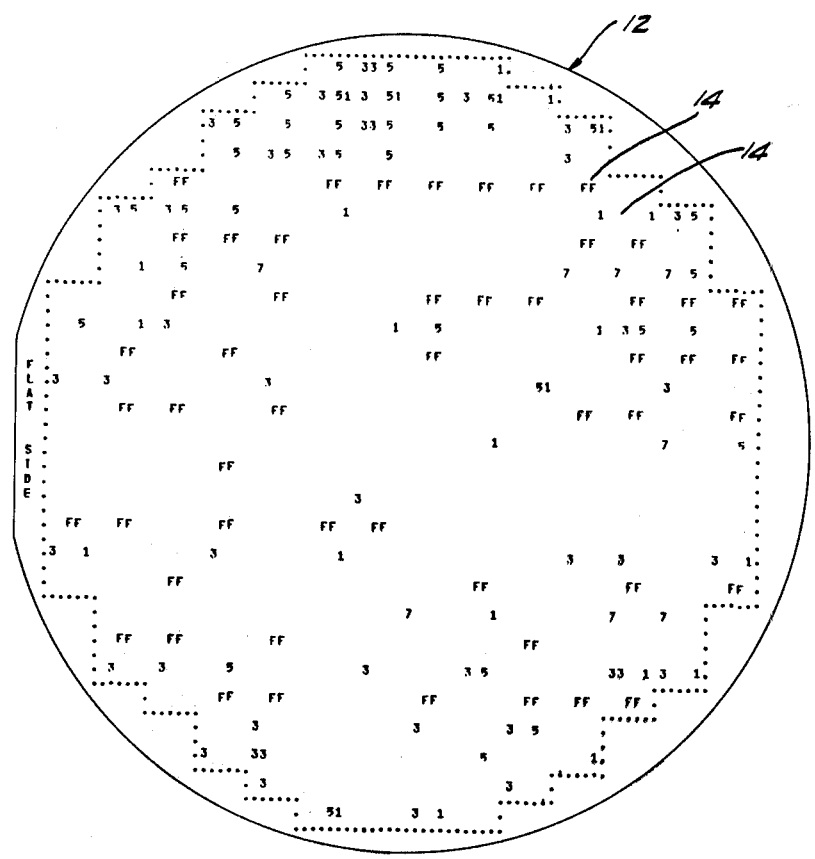
FIG. 1 is a schematic graphical illustration of the yield distribution of usable cells relative to a master pattern of cell locations wherein selected usable cells are relocated to master pattern cell locations.

Referring now to the drawings in more detail, FIG. 1 illustrates an integrated circuit wafer 12 having a predominantly circular periphery except for one portion thereof which is formed as a straight edge so that the integrated circuit wafer can be properly oriented. The integrated circuit wafer 12 is further divided into a plurality of individual integrated circuit cells 14 which are generally rectangular and, in the embodiment illustrated, arranged in a rectilinear array. Each one of these cells can, for example, be 0.060 inch by 0.060 inch and larger and is electrically separated from the adjacent cells by a border of electrically isolating material. The cell itself can include a plurality of active circuit elements such as semiconductor diodes and transistors and passive elements such as conductors, resistors, and capacitors. These elements are coupled together by metalization in the wafer 12 into a predetermined circuit configuration so that when electrical signals are applied to signal connects of the cells, it will operate in a predetermined manner.

Figure 2A:
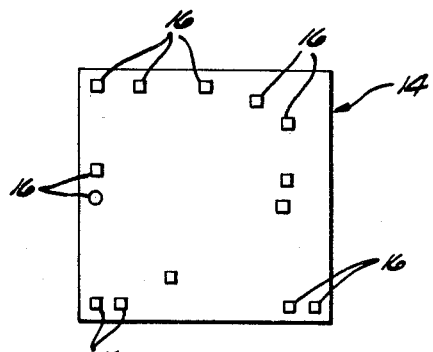
FIG. 2a is an enlarged top plan view schematically illustrating exemplary pad locations in the first layer of metalization of an integrated circuit cell.

In order to facilitate signal connections with the individual cells 14 each cell includes a plurality of signal connect members or pads 16 (FIG. 2a) located at termination ends of signal lines. These pads 16 usually have a somewhat larger dimension and area than the signal line widths which they are associated with. For example, the pads 16 can have a dimension of 0.003 inch × 0.003 inch whereas the associated conductor may only be 0.001 inch wide. There can, for example, be fourteen or possibly more or fewer of these pads 16 associated with each cell. The active and passive elements of each cell are usually arranged internally of the cell 14 so that electrical signals can be applied to some of the pads 16 whereupon a portion of the integrated circuit components can be used as a gate, flip-flop, or other circuit element; or else input or output lines can be coupled to all of the pads of a cell so that that cell operates as a complete logic circuit. Hereinafter, when the term cell is used, it should be understood that this is intended to cover both the entire cell or any functional portion thereof. Furthermore, in those instances where the term "usable cells" is used, it is intended to be synonymous with the term "good cells" or any portion thereof.

The yield of usable cells to total cells on the wafer 12 has heretofore been less than 100%. For example, the yield typically can be between 20% and 80% and possibly more. With such yield there is no discernible pattern to the specific locations of usable cells 14 and unusable cells 14 since they are located unpredictably across the array even though there is a tendency for good cells 14 to be predominantly located toward the center of the wafer 12.

In order to determine which of the cells 14 is usable or good, they are generally tested electrically so that the good cells can be determined and properly identified. Generally a d.c. electrical test is made of each circuit to obtain adequate identification of the good circuit. In addition, further a.c. electrical testing of the good cells can be performed for added confidence in the operational capabilities of the circuit.

After electrical testing of the cells 14 has been completed, it is usually determined that the unusable cells occur in an unpredictable pattern as exemplified by the symbols "1", "3", "6", "7" and "FF" located within the rectangular integrated circuit cells 14 of FIG. 1. In this particular example; the symbol "1" is representative of a defective one input NAND gate; the symbol "3" is representative of a defective three input NAND gate; the symbol "5" is representative of a defective five input NAND gate; the symbol "7" is representative of a defective seven input NAND gate; and the symbol "FF" is representative of a defective flip-flop. Those cells that do not have one of the above identified symbols located therein are representative of a good or usable integrated circuit cell 14.

The pads 16 of selected usable cells 14 are left exposed by means of vias through a first layer of dielectrical insulation 22. Thereafter, groups of cells 14 can be interconnected into functional circuits such as, for example, latch flip-flops, half adders, exclusive OR gates, etc. in a second level of metalization 28 by means of cell interconnect conductors 18 formed therein and routed between the exposed pads as will be explained in more detail with reference to FIG. 4. If signal connect portions of these cell interconnect conductors do not coexist at, or are not in registry with, master pattern circuit locations, signal connect relocation conductors 20 are routed from the cell interconnect conductors 18 to master pattern circuit locations.

When a master pattern circuit location does not contain or coexist with the signal connects of a usable cell or cells, it is necessary to relocate the pads 16 of a selected nearby usable cell 14 to pad locations at a master pattern circuit or cell location in a manner to be described in more detail subsequently with reference to FIG. 4.

As a result of the relocation of the signal connects of selected cells 14 to the master pattern circuit location where no signal connects would otherwise be found, a common or master pattern of signal connects is effectively established. This allows standard or master pattern masks of vias and interconnect lines to be used to form an additional top layer of master pattern interconnect lines for interconnecting the individual and functionally interconnected cells 14 together into a specific part type, as will be described in more detail with reference to FIG. 5.

Figure 2B:
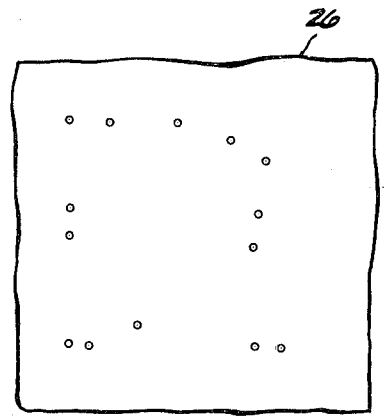
FIG. 2b is an enlarged schematic illustration of a portion of a mask of the type associated with the vias in a layer of insulation to expose the pads of an integrated circuit cell.
Figure 3A:
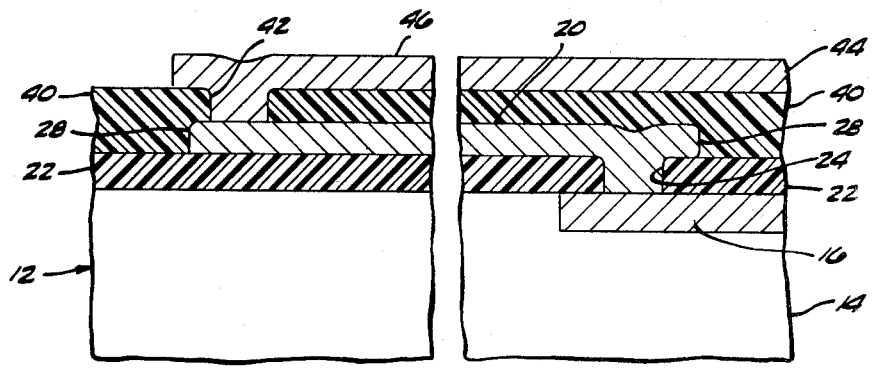
FIG. 3a is an enlarged cross-sectional side elevational view, not to scale, illustrating the relationship between the integrated circuit cell, vias in a first layer of dielectric insulation, pad relocation lines in a second layer of metalization, a master pattern vias in a second layer insulation, and master pattern interconnect lines in a third layer of metalization.

Reference is now made to one such fabrication of a complex integrated circuit, specific processing details of several techniques being described in copending patent application Ser. No. 206,555, filed Dec. 9, 1974, entitled Integrated Circuit Interconnections By Pad Relocation, now U.S. Pat. No. 3,795,972 a division of Ser. No. 762,459, filed on Sept. 25, 1968. As illustrated in FIG. 3a, the first layer of metalization, integral with the surface of the wafer 12 and containing the pads 16 (FIG. 2a), has a layer of dielectric insulation material 22 such as low sodium glass or quartz formed thereon with vias 24 or feedthroughs processed therethrough in registration with the pads 16 of selected cell 14. These vias 24 are formed in the insulation 22 by a photoprocess such as by utilizing a via mask 26 produced for that particular wafer, a portion of which is shown in FIG. 2b. This via mask 26 selectively exposes a layer of photoresist so that a portion of the photoresist remains over the selected pads 16 while the layer of insulation 22 is formed. When the photoresist is subsequently removed, vias 24 are formed through the insulation 22 which expose the pads 16.

It should be understood that the entire mask 26 for vias 24 has not been illustrated in detail in FIG. 2b since the scale on patent drawings is too small to adequately illustrate a vias aperture having an actual dimension of 0.001 inch. However, the specific location of vias 24 in the first layer of electrical insulation 22 can be identified and determined by referring to FIGS. 4 and 5 wherein the vias 24 are located at the termination ends of individual conductors in the second layer of metalization that are not coincident with another terminating end of conductors in the third layr of metalization or when the two extra metalization layers of interconnects are superposed over one another.

Figure 4:
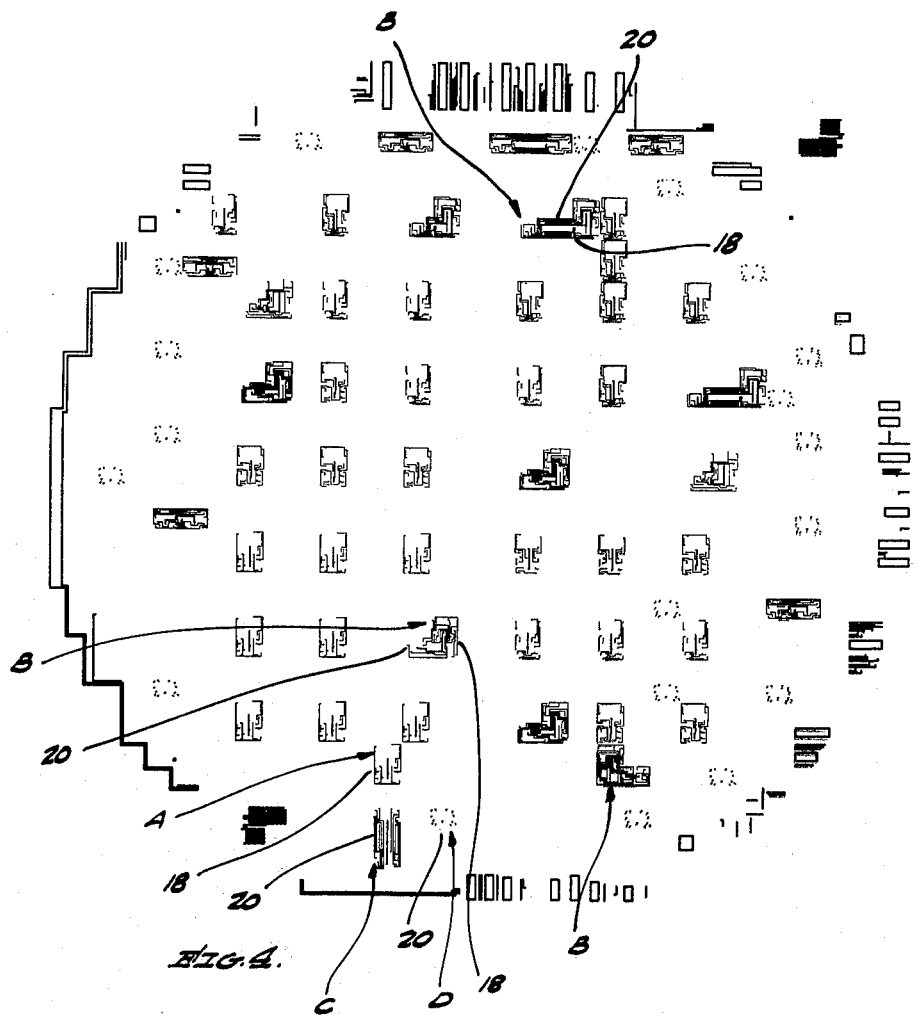
FIG. 4 is a top plan view of the second layer of metalization illustrating cell interconnect conductors and pad relocation conductors formed therein.

For purposes of illustration, the enlarged crosssectional view, not to scale, in FIG. 3a schematically illustrates a via 24 extending from a pad 16 in the first layer of metalization on the face of an integrated circuit cell 14 to the second layer of metalization 28 such as, for example, aluminum which contains the cell interconnect conductors 18 and signal contact relocation lines 20 illustrated in FIG. 4.

More specifically, as illustrated in FIG. 4, the second layer of metalization 28 includes cell interconnect lines 18 for functionally interconnecting a plurality of cells together as a functional building block at the second layer of metalization. The cell interconnect lines 18 include a plurality of straight line segments illustrated as being routed parallel to rectilinear coordinates between selected exposed pads 16 of a plurality of cells. In the particular embodiment illustrated, two cells are functionally interconnected by the cell interconnect lines 18. Of course, it is possible to functionally interconnect the gates of a single cell or the gates of more than two cells. Termination ends of these cell interconnect lines and signal connects thereof are coupled to the exposed pads 16 through vias 24 to the first layer of dielectric insulation 22.

Referring to specific conductor routing in FIG. 4, the two cells are interconnected into a functional building block by the cell interconnect conductors 18 indicated generally as the group of conductors A. Portions or segments of these cell interconnect conductors 18 are routed to and through master pattern circuit locations, whereat signal connects can be made, so that there is no need for separate signal connect relocation lines 20. A second group of conductors B include cell interconnect conductors 18 routed between the exposed pads of two cells to connect them into a functional building block and further includes signal connect relocation lines 20 which are routed between signal connect portions of the cell interconnect conductors 18 and master pattern circuit locations. The termination ends of these signal connect conductors 18 at the master pattern circuit locations are formed into enlarged area pads to facilitate connection therewith. The group of conductors C illustrate signal connect relocation lines 20 routed from the exposed pads of a single cell to master pattern circuit locations. The group of conductors D illustrate conductors 20 associated with a usable cell which occurs in coincidence with or in registry with a master pattern circuit location whereupon the pads are brought to the second level of metalization in registry with the cell. Of course, it is possible to first relocate the pads of a usable cell to master pattern circuit location by lines 20 and then to functionally interconnect the signal connects of cells at master pattern circuit locations.

The cell interconnect lines 18 of those groups of cells which do not include signal connect relocation lines 20 can be fabricated into an enlarged area or pad at the master pattern circuit locations where desired to facilitate connection therewith. It should also be noted that the line lengths for the cell interconnect lines 18 and the signal connect relocation lines 20 in the second level of metalization are short. As previously mentioned with reference to FIG. 1, these signal connect relocation lines 20 are each routed from pads 16 of selected usable cells or from cell interconnect conductors 18 to a master pattern circuit location. These master pattern circuit or cell locations include not only areas congruent to and superposed over wafer cells 14 but also includes areas above the wafer not in registry with or superposed over any one cell or bounded by any cell. For example, such master pattern locations can be the relocated signal connect end or pads of the signal connect relocation conductors 20. Although these pad relocation lines are typically straight line segments 0.003 inch wide on 0.004 inch centers extending parallel to rectilinear coordinates, it would be possible to use other configurations and routing. The signal connect portions of the signal connect relocation conductors 20 are generally dimensioned at least as wide as a pad or can be formed into enlarged area pads (FIG. 4) or can be made narrower.

Figure 3B:
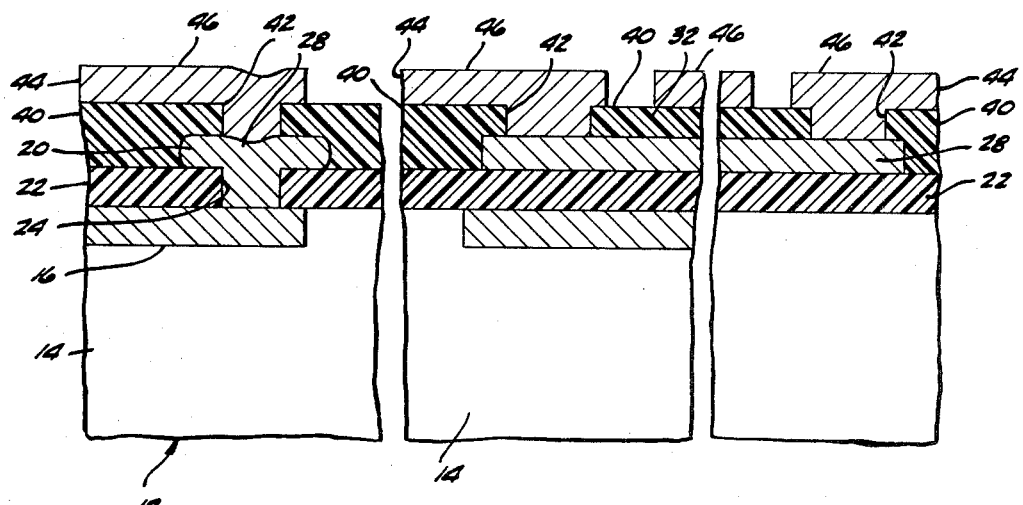
FIG. 3b is an enlarged cross-sectional side elevational view, not to scale, illustrating the relationship of the layers of dielectric insulation and vias between the pads of a usable integrated circuit cell and the master pattern interconnect line in a third layer of metalization, and in addition illustrates the relationship between master pattern vias in the second layer of insulation and crossunders in the second layer of metalization.

Furthermore, as illustrated in FIG. 3b where a good cell, such as cell 14' coexists at a master pattern circuit location, the via above cell 14' via 24', formed through the first layer of electrical insulation 22 merely exposes the pad 16' of that good cell without necessarily requiring further routing of pad relocation lines 20' such as illustrated in FIG. 3a.

In addition to the pad relocation lines 20, the second layer of metalization 28 can include a plurality of crossunder conductor segments 32 located at reserved locations on the face of the first layer of insulation 22.

It should also be understood that these individual cell interconnect conductors 18 and signal connect relocation lines 20 are also formed in the second layer of metalization 28 by a photo process utilizing photoresist material and etching techniques, as described in more detail in the above referenced copending U.S. Pat. No. 3,795,972. One technique is to expose the photoresist with a mask having conductors of the type illustrated in FIG. 4 tailored to the yield distribution of each wafer wherein the master pattern circuit locations are common to a plurality of wafers.

A second layer of dielectric insulation 40, such as for example, low sodium glass or quartz, is formed on top of the second layer of metalization 28 with fixed position or master pattern vias 42 formed at master pattern circuit locations by a master pattern mask common to all wafers which have the signal connects of usable individual and functionally interconnected cells at master pattern circuit locations and which are to be fabricated into a specific part type. A portion of these vias 47 expose the terminating ends, signal connect portions, or pads, of cell interconnect lines 18 and pad relocation lines 20 in the second layer of metalization 28 as illustrated in FIG. 3a. In addition, some of the vias, e.g., via 42' are superposed over the vias 24' in the first layer of electrical insulation 22 as illustrated in FIG. 3b so that the pads 16 of the good cell in registry with the master pattern cell location are exposed to the top layer or third layer of metalization 44. In addition, some vias 42 can be formed between terminating ends of standard pattern conductors 46 and the selected cross-under conductor segments 32. It should be noted that the cross-unders 32 are not otherwise connected with the pads in the first layer of metalization or with pad relocation lines 20 in the second layer of metalization.

Figure 5:
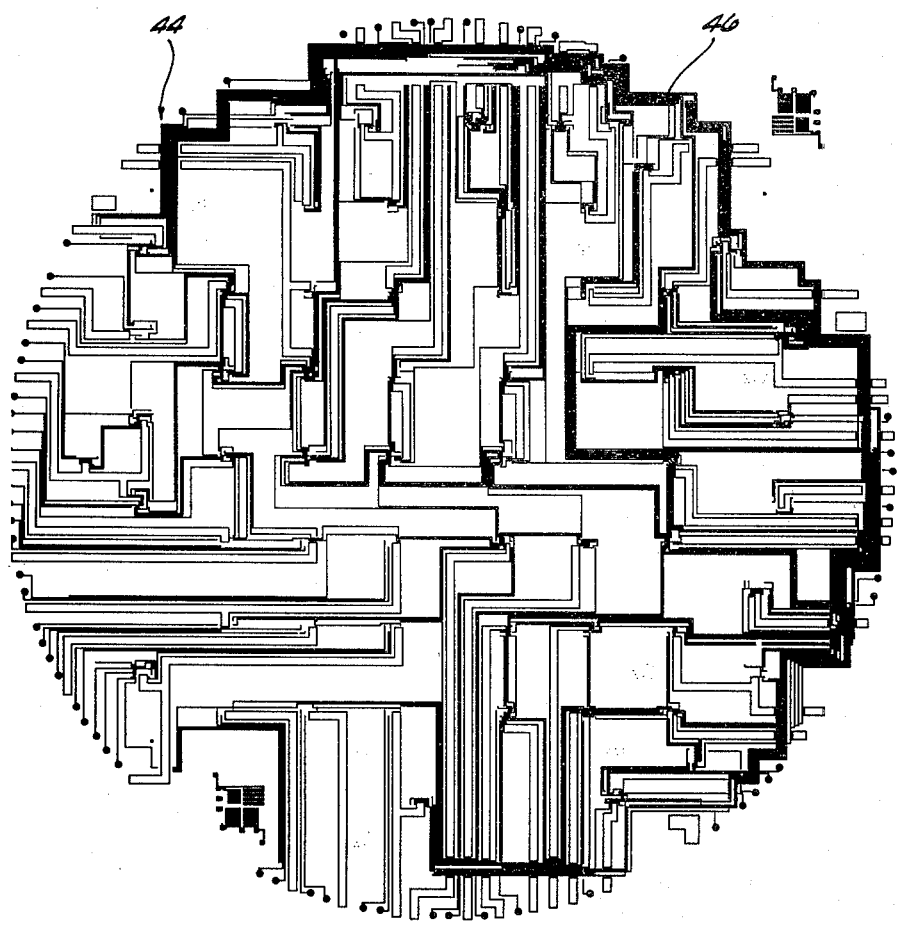
FIG. 5 is a top plan view of the third layer of the metalization illustrating the master pattern interconnect lines which are selectively connected to the exposed pads of usable cells and functionally interconnected cells at master pattern circuit locations.

Thereafter, the top layer or third layer of metalization 44 such as, for example, aluminum, is formed on top of the second layer of dielectrical insulation 40 with the terminating ends or portions of the fixed or master pattern of interconnect lines 46 illustrated in FIG. 5 in registry with the vias 42 in the second layer of insulation 40. As a result, the signal connects at individual master pattern circuit locations are interconnected into a specified functional circuit which, when electrical signals are applied to the signal inputs thereof, will operate in a predetermined manner to produce output signals of predetermined characteristics at its output terminals. It should be understood that the standard pattern conductors or interconnect 46 in the top layer of metalization 44 are also formed with a relatively simple routing on a master pattern mask common to all wafers having usable cells at master pattern circuit locations and which are to be interconnected into a specific function part type circuit, by means of the photoresist technique in combination with etching techniques.

As previously mentioned, advantages of this device are that: there is a reduction in the number of point to point connections made in the third level standard signal routing; there is a decrease in the number of master pattern positions (circuits or cells) as a result of the interconnected functions in the second level of metalization; there is a decrease in the number of signal connect relocation lines in the second level metalization pattern due to the interconnection prior to relocation: and there is a significant reduction in the average logic signal line lengths due to the very efficient functional cell interconnections thereby reducing signal degradation caused by line resistance and capacitance.

While salient features have been illustrated and described with respect to a particular embodiment, it should be readily apparent that modifications can be made within the spirit and scope of the invention.

What is claimed is:

1. A multi-level complex integrated circuit of the type which defines a configuration of signal-connect portions, vias and integrated circuits which are the same in location for a plurality of wafers having the same functional circuit type, including:

a wafer having a plurality of cells in a nonstandard yield distribution of usable cells;

a first level of means for defining dielectric insulation formed on said wafer and having means for defining vias formed through said insulation for exposing signal-connects of selected ones of said usable cells;

a first level of metalization formed on said first level dielectric insulation means including electrical conductor means routed between and from said exposed signal connects of said usable cells to signal-connect portions for interconnecting at least one of said selected usable cells into at least one functional circuit, and for defining a routing of said signal-connects of said selected usable cells to locations of circuits corresponding to the configuration of signal-connect portions which is the same for the plurality of the wafers having the same functional circuit type, at least one of said signal-connect portions being positioned substantially directly above at least one of said signal-connects and at least one other of said signal-connect portions being positioned above and substantially laterally spaced from at least a corresponding one of said signal-connects;

a second level of means for defining dielectric insulation formed on said electrical conductor means and having means for defining vias formed through said second level dielectric insulation means corresponding to a configuration of means for defining the vias which is the same for the plurality of the wafers having the same functional circuit type for having exposed said signal-connect portions of said electrical conductor means at the circuit locations; and at least a second level of metalization formed on said second level of dielectric insulation means including means for defining electrical interconnects routed between and from said exposed signal-connect portions at the circuit locations and corresponding to the configuration of integrated circuits which is the same for the plurality of the wafers having the same functional circuit type for having interconnected said selected usable cells into the functional circuit type.

2. The circuit of claim 1 in which said signal-connects include a pad dimension greater than the width of individual ones of said electrical conductor means.

3. The multi-level complex integrated circuit of claim 1 in which said electrical conductor means in said first level of metalization formed on said first level of dielectric insulation means includes cell interconnect conductors routed between said exposed signal-connects of at least two of said selected usable cells for functionally coupling said selected usable cells, said cell interconnect conductors being routed to the circuit locations.

4. The multi-level complex integrated circuit of claim 1 in which said electrical conductor means in said first level of metalization formed on said first level of dielectric insulation means includes signal-connect relocation conductors routed substantially laterally across the wafer from said corresponding one of said exposed signal-connects associated with said selected usable cells to said corresponding one of said signal-connect portions at the circuit locations.

5. The circuit means of claim 4 in which said signal-connect means further includes a pad dimension greater than the width of individual ones of said electrical conductor means.

6. The multi-level complex integrated circuit of claim 1 in which said electrical conductor means in said first level of metalization formed on said first level of dielectric insulation means includes cell interconnect conductors routed between said exposed signal-connects of individual groups of said selected usable cells for functionally coupling said selected usable cells together, and includes signal-connect relocation conductors routed substantially laterally across said wafer from said cell interconnect conductors to the circuit locations which are the same for the plurality of the wafers having the same functional circuit type for defining a routing of a portion of said selected usable cells including said corresponding one other of said signal-connect portions which are not vertically coincident with any of the circuit locations.

7. The multi-level complex integrated circuit of claim 6 in which said electrical conductor means includes signal-connect conductors routed substantially vertically from said exposed signal-connects of single ones of said usable cells vertically aligned with the circuit locations.

8. The multi-level complex integrated circuit of claim 1 in which said electrical conductor means in said first layer of metalization formed on said first level of dielectric insulation means is routed in a pattern corresponding to the yield distribution of usable cells of an individual wafer, and said electrical interconnect means in said second level of metalization are routed in the pattern common to all the wafers which have signal-connect portions at the circuit locations and which are interconnected into the functional circuit type.

9. A complex integrated circuit structure in a single body which defines a configuration at least of circuit locations and electrical routings that are the same in location for all other circuit structures capable of performing a particular electrical function, the structure comprising:

an array of cells of which some are usable and the remainder are nonusable, each of said cells having a plurality of signal-connects, said cell array having random positions of said usable and nonusable cells, said cell including a plurality of said usable cells selected from any of said usable cells irrespective of the random positions and being at least equal in number to the number of usable cells required to perform the electrical function;

said selected usable cells being interconnected for performing the electrical function by a plurality of interconnection layers including at least first and second interconnection layers of first interconnections and second interconnections respectively;

at least a first dielectric layer between said first interconnection layer and said signal-connects of said cells, said first dielectric layer having means therein for defining a plurality of first apertures, each of said first aperture means being aligned in registry with each of said signal-connects of said selected usable cells, each of said first interconnections extending through each of said first aperture means of said first dielectric layer and connected to each of said signal-connects of said selected usable cells, said first dielectric layer covering and otherwise electrically insulating said usable and nonusable cells and said signal-connects of said usable cells not selected from said cell array;

a second dielectric layer between said first interconnection layer and said second interconnection layer, said second dielectric layer having means therein for defining a plurality of second apertures, each of said second interconnections extending through each of said second aperture means of said second dielectric layer into connection with at least each of said first interconnections of said first interconnection layer, for interconnecting said second interconnection layer to said selected usable cells, and for interconnecting each of said second interconnections respectively to at least each of said signal-connects of at least one of said selected usable cells by at least one continuous substantially vertically extending interconnection path from said second interconnection layer through said first and second aperture means of said dielectric layers; and said first interconnections terminating in locations of circuits defined by said second aperture means and corresponding to the configuration of the circuit locations which are the same for all the other circuit structures for performing the electrical function, and at least two of said selected usable cells interconnected to each other by means for defining the routings contained entirely within said first interconnection layer for coupling at least one of said second interconnections to said routing means, said routing means corresponding to the configuration of the electrical routings which is the same for all the other circuit structures for performing the electrical function.

10. The structure set forth in claim 9 in which said first interconnections of said first interconnection layer include conductors routed among said signal-connects of different ones of said selected usable cells, said conductors being routed to said locations of circuits, at least some of said signal-connects of said selected usable cells being substantially vertically aligned with said second aperture means of said second dielectric layer.

11. The structure set forth in claim 9 in which some of said first interconnections of said first interconnection layer are routed from corresponding ones of said first aperture means of said first dielectric layer to said locations of circuits which are laterally spaced on the single body from said corresponding ones of said first aperture means and aligned with corresponding ones of said second aperture means of said second dielectric layer.

12. The structure set forth in claim 9 in which said first interconnections of said first interconnection layer further includes a first group of conductors routed on said first dielectric layer between said signalconnects of individual groups of said selected usable cells including at least said two of said selected usable cells for forming a partial integration thereof into the electrical function, and a second group of conductors routed on said first dielectric layer from said first group of said conductors to said locations of circuits.

13. The structure set forth in claim 11 in which said first interconnections include conductors routed from said signal-connects of single ones of said selected usable cells to said locations of circuits.

14. The structure set forth in claim 9 in which said first interconnections are routed in a pattern corresponding to the yield distribution of said usable cells and in which said second interconnections are routed in a pattern which is fixed with respect to said signal-connects and located at said locations of circuits.

15. A plurality of integrated circuit members each capable of performing the same electrical function, and each comprising:

a plurality of functionally separate circuits on each of said circuit members in which some of said circuits are operable and the remainder are inoperable and in which the operable and the inoperable circuits are randomly positioned on each of said circuit members in a first level of metalization, each of said functionally separate circuits having means for defining a plurality of primary signal-connects associated therewith, said functionally separate operable circuits including a number of said operable circuits selected from any of said operable circuits irrespective of the positions of said operable circuits and at least being capable of performing the electrical function;

means for defining a plurality of secondary signal-connects at a second level of metalization otherwise electrically isolated from said functionally separate circuits and said primary signal-connects by means for defining electrical insulation having means therethrough for defining vias, said secondary signal-connect means being interconnected there-amongst for partially integrating said selected operable circuits into the electrical function and having locations identical among all of said circuit members, in which some of the identical locations are spaced substantially laterally from and others thereof are positioned substantially directly above said primary signal-connect means of said selected operable circuits; and means for defining electrical conductors for coupling said secondary signal-connect means through said vias means to said primary signal-connect means and for at least partially integrating said selected operable circuits into the electrical function.

16. The improvement of claim 15 further comprising:
means on each of said integrated circuit members for defining a first level layer of said electrical conductor means coupled in the partial circuit integration to said primary signal-connect means of said selected operable circuits and routed over each of said integrated circuit members in otherwise electrical isolation from said inoperable circuits, the identical locations forming a first level standard pattern of said secondary signal-connect means in the partial circuit integration that is identical for each of said integrated circuit members; and means on each of said integrated circuit members for defining a second level layer of said electrical conductor means selectively coupled to said secondary signal-connect means in the first level standard pattern and routed from said secondary signal-connect means in substantial electrical isolation from said first level layer of said electrical conductor means in a second level standard pattern that is identical for each of said integrated circuit members for forming a third level standard pattern that is identical for each of said integrated circuit members for electrically interconnecting said primary signal-connect means of said selected operable circuits into a specific more complex circuit type.

17. The improvement of claim 16 for each of said integrated circuit members in which the number of the identical locations forming the first level standard pattern of said secondary signal-connect means is less than the total number of said primary signal-connect means of said selected operable circuits on each of said integrated circuit members.

18. The improvement of claim 17 for each of said integrated circuit members in which the density of the identical locations forming the first level standard pattern of said secondary signal-connect means varies in accordance with the statistically expected density of the distribution of said selected operable circuits on each of said integrated circuit members at the superposed primary and secondary signal-connect means thereof.

19. The improvement of claim 16 for each of said integrated circuit members in which said electrical conductor means of said first level layer means further includes interconnected electrical conductor line segments positioned at selected areas through which no electrical conductors are routed and none of said primary signal-connect means are positioned, said first level electrical conductor line segments connected to said electrical conductor means of said second level layer means by crossing under said second level layer means.

20. In a unitary integrated circuit member capable of performing an electrical function and having a plurality of functionally separate circuits located thereon, in which some of said functionally separate circuits are usable and the remainder are unusable and in which said usable and unusable circuits have random positions differing from similar functionally separate usable and unusable circuits on other unitary integrated circuit members capable of performing the same electrical function, and in which each of said circuits have means for defining a plurality of individual signal-connects at a first level of metalization, the improvement in providing at least a partially integrated interconnection of said usable circuits having a standard pattern of identical locations of means for defining second individual signal-connects, said usable circuits being selected from any of said usable circuits irrespective of their positions on any of said circuit members, and said standard pattern being the same for all of said circuit members, comprising:

a first layer of dielectric material on said circuit member at the first level having a plurality of means for defining apertures formed therethrough for exposing only said individual signal-connect means of said selected usable circuits;

a first metalization layer of electrical conductors formed on said first layer of dielectric material, said conductors including interconnected line segments configured into at least said partially integrated interconnection and extending from said individual signal-connect means of said selected usable circuits exposed by said aperture means to a plurality of said second individual signal-connect means at the identical locations for forming at least said partially integrated interconnection having the standard pattern on a second level, and for configuring the standard pattern of the circuit locations common to all of said integrated circuit members;

at least some of said second individual signal-connect means being located substantially vertically above corresponding ones of said first level signal-connect means; and alternate layers of further dielectric material and metalization material on said first layers, each of said alternate layers including a second layer of dielectric material formed on said first layer of conductors having means for defining a plurality of second apertures formed therethrough at the standard pattern locations for exposing only said second signal-connect means, and a second metalization layer of electrical conductors formed on said second layer of dielectric material, said electrical conductors of said second metalization layer configured in further circuit integration of said selected usable circuits for defining a routing thereof in a second standard pattern common to all of said integrated circuit members having appropriate signal-connect means and for interconnecting said selected usable circuits into a specific more complex circuit type.

21. A plurality of integrated circuit members each capable of performing the same electrical function and each comprising:

a plurality of functionally separate circuits on each of said circuit members in which some of said circuits are used and the remainder are unused and in which said used and said unused circuits are randomly positioned on each of said circuit members;

means for defining partial integration of at least one of said used circuits into the electrical function and having a plurality of secondary signal-connect areas, said partial integration means having a configuration and said secondary signal-connect areas having locations which are common to all of said circuit members having the same electrical function, and at least some of said secondary signal-connect areas being located substantially vertically above corresponding ones of said used circuits; and electrical conductor means coupling any said used circuit to any said signal-connect area, irrespective of the location of any said used circuit.

* * * * *